US012720942B2

(12) United States Patent
Robin et al.

(10) Patent No.: US 12,720,942 B2
(45) Date of Patent: Aug. 25, 2026

(54) OPTOELECTRONIC DEVICE

(71) Applicant: Aledia, Echirolles (FR)

(72) Inventors: Ivan-Christophe Robin, Grenoble (FR); Eric Pourquier, Grenoble (FR); Bruno Mourey, Coublevie (FR)

(73) Assignee: Aledia, Champagnier (FR)

( * ) Notice: Subject to any disclaimer, the term of this patent is extended or adjusted under 35 U.S.C. 154(b) by 649 days.

(21) Appl. No.: 18/028,201

(22) PCT Filed: Sep. 29, 2021

(86) PCT No.: PCT/EP2021/076727
§ 371 (c)(1),
(2) Date: Mar. 23, 2023

(87) PCT Pub. No.: WO2022/069506
PCT Pub. Date: Apr. 7, 2022

(65) Prior Publication Data

US 2023/0378236 A1 Nov. 23, 2023

(30) Foreign Application Priority Data

Sep. 30, 2020 (FR) ...................................... 2010001

(51) Int. Cl.
*H10H 29/30* (2025.01)
*H10H 20/01* (2025.01)
(Continued)

(52) U.S. Cl.
CPC ........ *H10H 29/30* (2025.01); *H10H 20/8312* (2025.01); *H10H 20/857* (2025.01);
(Continued)

(58) Field of Classification Search
CPC .......... H10D 30/60–798; H10D 30/021–0415; H10D 84/83–859; H10D 86/40–60;
(Continued)

(56) References Cited

U.S. PATENT DOCUMENTS 10,068,888 B2 * 9/2018 Zhang .................. H10W 90/00
2007/0272939 A1 * 11/2007 Peng .................... H10H 20/857
257/E25.032
(Continued)

FOREIGN PATENT DOCUMENTS

EP 3 070 752 A1 9/2016
KR 20210057941 A * 5/2021 ........... G06F 3/0412

OTHER PUBLICATIONS

International Preliminary Report on Patentability for International Application No. PCT/EP2021/076727, mailed Apr. 13, 2023.
(Continued)

*Primary Examiner* — Scott B Geyer
(74) *Attorney, Agent, or Firm* — Wolf, Greenfield & Sacks, P.C.

(57) ABSTRACT

An optoelectronic device including a first circuit including at least one light-emitting diode emitting through a first surface of the first circuit and including first and second electrodes; a second circuit for controlling the light-emitting diode, positioned on a second surface of the first circuit opposite to the first surface, including first and second electrically-conductive pads; and an electrically-conductive layer located at the interface between the first and second circuits, the electrically-conductive layer being divided into first and second portions orthogonally to the stack of the first and second circuits, the first electrode being electrically coupled to the first conductive pad via the first portion of the conductive layer and the second electrode being electrically coupled to the second conductive pad via the second portion of the conductive layer.

23 Claims, 9 Drawing Sheets

(51) Int. Cl.
*H10H 20/831* (2025.01)
*H10H 20/857* (2025.01)
*H10H 29/14* (2025.01)
*H10H 29/85* (2025.01)
*H10W 90/00* (2026.01)

(52) U.S. Cl.
CPC ........ *H10H 29/142* (2025.01); *H10H 29/857* (2025.01); *H10W 90/00* (2026.01); *H10H 20/018* (2025.01)

(58) Field of Classification Search
CPC ...... H10D 84/80; H10D 84/811; H10H 29/10; H10H 29/14; H10H 29/142; H10H 29/30–49; H10W 90/20–297
See application file for complete search history.

(56) References Cited

U.S. PATENT DOCUMENTS

| | | | | |
|---|---|---|---|---|
| 2014/0191246 | A1* | 7/2014 | Oraw | H10W 90/00 438/25 |
| 2015/0362165 | A1 | 12/2015 | Chu et al. | |
| 2016/0105247 | A1* | 4/2016 | Cheng | H01S 5/3013 438/24 |
| 2016/0247855 | A1* | 8/2016 | von Malm | H10D 86/60 |
| 2017/0133550 | A1 | 5/2017 | Schuele et al. | |
| 2017/0179097 | A1 | 6/2017 | Zhang et al. | |
| 2017/0358562 | A1* | 12/2017 | Banna | H10W 90/00 |
| 2018/0247922 | A1* | 8/2018 | Robin | H10H 20/018 |
| 2018/0358339 | A1 | 12/2018 | Iguchi | |
| 2019/0139949 | A1 | 5/2019 | Liu et al. | |
| 2019/0165231 | A1 | 5/2019 | Doan et al. | |
| 2019/0198735 | A1* | 6/2019 | Tsai | H10H 20/857 |
| 2020/0168777 | A1* | 5/2020 | Kang | H10W 90/00 |
| 2021/0151428 | A1* | 5/2021 | Dutta | H10D 30/475 |

OTHER PUBLICATIONS

International Search Report and Written Opinion for International Application No. PCT/EP2021/076727, mailed Jan. 4, 2022.

* cited by examiner

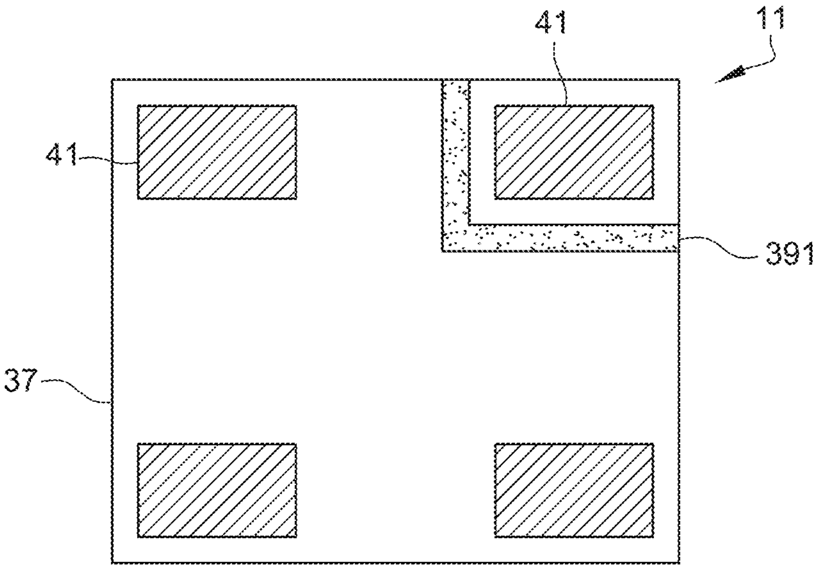
Fig. 2
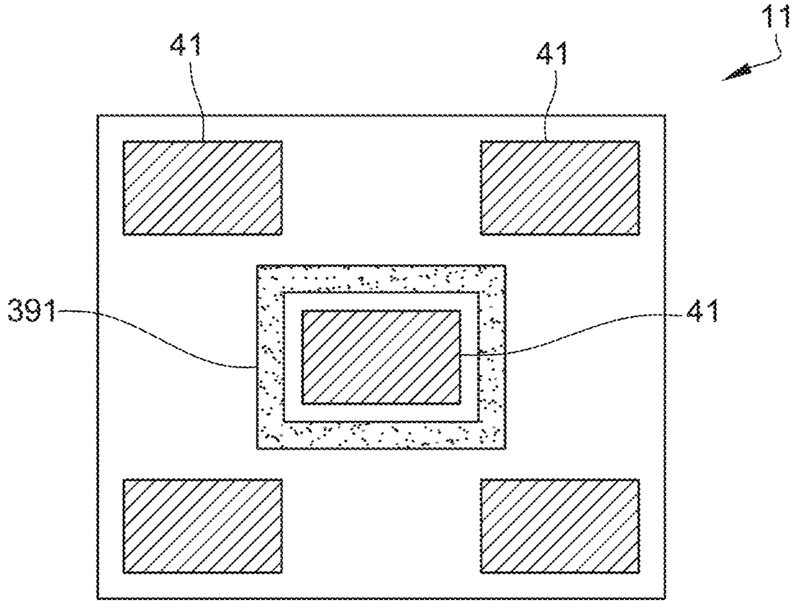
Fig. 3
Fig. 4
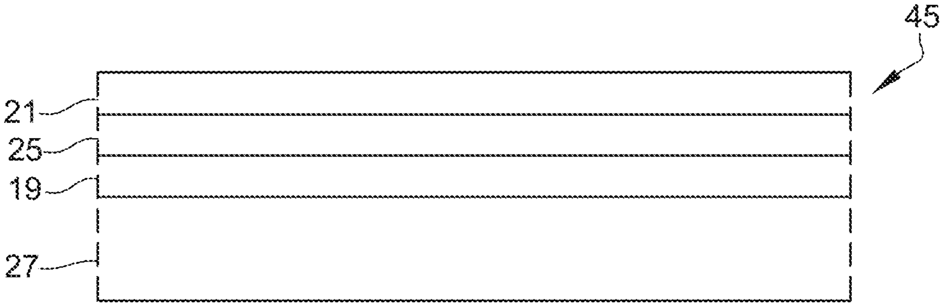

Fig. 13
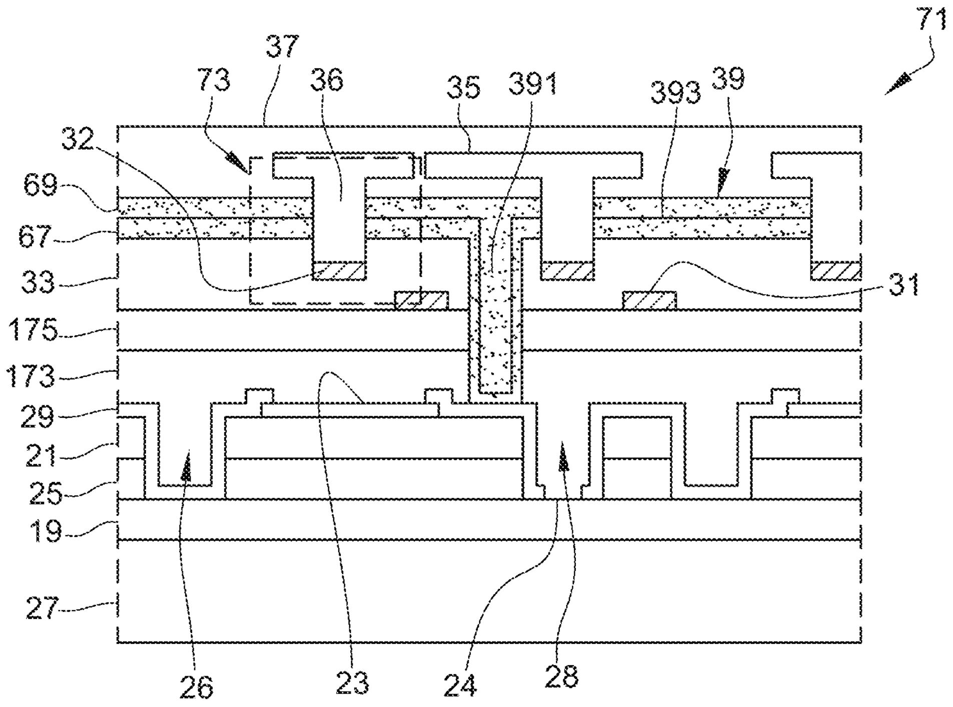
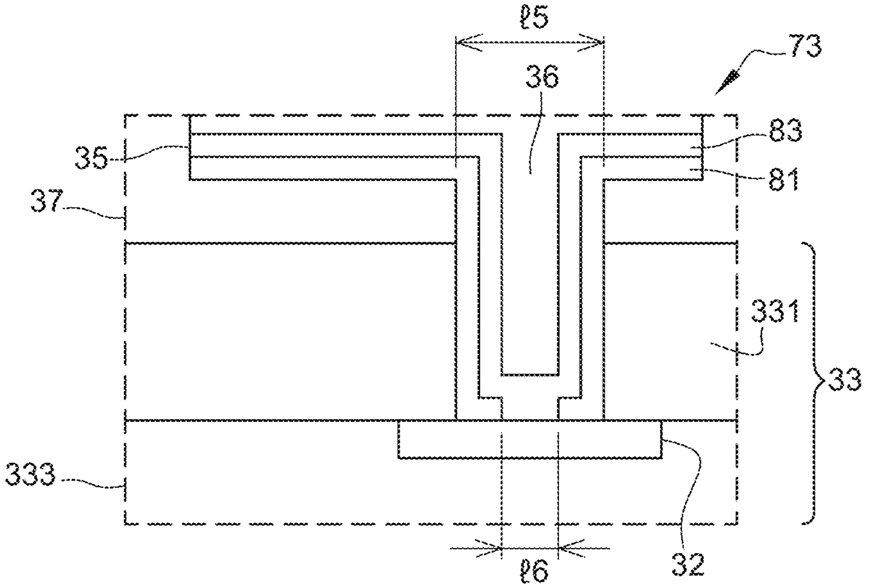
Fig. 14

OPTOELECTRONIC DEVICE

This Application is a national stage filing under 35 U.S.C. § 371 of International Patent Application Serial No. PCT/EP2021/076727, filed Sep. 29, 2021, which claims priority to French patent application FR20/10001, filed Sep. 30, 2020. The contents of these applications are incorporated herein by reference in their entireties.

TECHNICAL BACKGROUND

The present disclosure generally concerns an optoelectronic device and its manufacturing method, for example, an image display device comprising light-emitting diodes and its manufacturing method.

PRIOR ART

It is known to form an optoelectronic device comprising at least one light-emitting diode and a circuit for controlling this light-emitting diode.

Document U.S. Ser. No. 10/468,452 describes a method of manufacturing such a device comprising the simultaneous manufacturing of a plurality of optoelectronic devices on a same substrate and the separation of the optoelectronic devices thus manufactured. A disadvantage of such a method is that it comprises the forming of electrodes covering the sides of the optoelectronic devices, which may be a step difficult to implement.

SUMMARY

There is a need to improve optoelectronic devices and their manufacturing methods.

An embodiment overcomes all or part of the disadvantages of known optoelectronic devices and their manufacturing methods.

An embodiment provides an optoelectronic device comprising a stack:

of a first circuit comprising at least one inorganic light-emitting diode emitting through a first surface of the first circuit and comprising first and second electrodes; and of a second circuit for controlling the light-emitting diode, positioned on a second surface of the first circuit opposite to the first surface, comprising first and second electrically-conductive pads, wherein an electrically-conductive layer, comprising the stacking of a first electrically-conductive sub-layer of the first circuit and of a second electrically-conductive sub-layer of the second circuit, is located at the interface between the first and second circuits, the electrically-conductive layer being divided into first and second portions orthogonally to the direction of the stacking of the first and second circuits, the first electrode being electrically coupled to the first conductive pad via the first portion of the conductive layer and the second electrode being electrically coupled to the second conductive pad via the second portion of the conductive layer.

According to an embodiment, the device comprises at least two connectors, located on the second circuit, on the side opposite to the first circuit, intended to electrically couple the device to an external object.

According to an embodiment, the first and second portions of the conductive layer are separated by an electrical insulation trench.

According to an embodiment, the first and second conductive pads are separated by said electrical insulation trench.

According to an embodiment, the second circuit comprises metal oxide gate field-effect transistors and comprises two portions electrically separated by said electrical insulation trench.

According to an embodiment, the portions of the second circuit are electrically coupled by connections by electrically-conductive tracks located on the side of the metal oxide gate field-effect transistors opposite to the first circuit.

According to an embodiment, the electrical insulation trench has a closed shape, in a plane parallel to the second surface.

According to an embodiment, the electrical insulation trench has, in a plane parallel to the second surface, an open shape having its two free ends emerging onto one or a plurality of sides of the device.

According to an embodiment, the first circuit comprises a substrate on the side of the first surface.

According to an embodiment, the substrate is made of sapphire or of glass.

According to an embodiment, the conductive layer is made of metal or of a conductive polymer.

According to an embodiment, the light-emitting diode is wire-shaped or pyramid-shaped.

An embodiment provides a structure comprising a plurality of optoelectronic devices such as described hereabove.

An embodiment provides a method of manufacturing a plurality of optoelectronic devices such as described hereabove, comprising a step a) of assembly of a first wafer comprising said plurality of first circuits to a second wafer comprising said plurality of second circuits.

According to an embodiment, assembly step a) is carried out by placing into contact, full plate, first and second sub-layers of the electrically-conductive layer.

According to an embodiment, each first circuit is partially etched at a step b) prior to step a) to define a first cavity located at the location of the second electrode.

According to an embodiment, each first circuit is partially etched at a step b') prior to step a), to form a second cavity enabling to define the edges of said light-emitting diode.

According to an embodiment, the method comprises a step c), between steps a) and b) or b'), where each light-emitting diode is covered, on the side of the second surface of the first circuit, with a dielectric layer open at the level of the first and second electrodes.

According to an embodiment, between step c) and step a), each light-emitting diode is covered, on the side of the second surface of the first circuit, with the first conductive sub-layer.

According to an embodiment, each second circuit is covered, before step a), with the second conductive sub-layer.

According to an embodiment, assembly step a) is formed by a non-hybrid bonding of the first conductive sub-layer with the second conductive sub-layer.

According to an embodiment, step a) is followed by a step d) of etching, for each optoelectronic device, of a trench extending in the second wafer and in the electrically-conductive layer all the way to the dielectric layer.

According to an embodiment, step d) is followed by a step of filling of the trench with an insulating material.

BRIEF DESCRIPTION OF THE DRAWINGS

The foregoing features and advantages, as well as others, will be described in detail in the following description of specific embodiments given by way of illustration and not limitation with reference to the accompanying drawings, in which:

FIG. 2 illustrates a partial simplified top view of an embodiment of an optoelectronic device;

FIG. 3 illustrates a partial simplified top view of another embodiment of an optoelectronic device;

FIG. 4 illustrates a step of an implementation mode of a method of manufacturing the device illustrated in FIG. 1A or 1B;

FIG. 13 illustrates another step of the method;

FIG. 14 is a detail view of a portion of FIG. 13;

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the circuits for controlling the light-emitting diodes of the optoelectronic devices have only been briefly detailed.

Unless indicated otherwise, when reference is made to two elements connected together, this signifies a direct electrical connection without any intermediate elements other than conductors, and when reference is made to two elements coupled together, this signifies that these two elements can be electrically connected or be electrically coupled via one or more other elements.

In the following disclosure, unless otherwise specified, when reference is made to absolute positional qualifiers, such as the terms “front”, “back”, “top”, “bottom”, “left”, “right”, etc., or to relative positional qualifiers, such as the terms “above”, “below”, “upper”, “lower”, etc., or to qualifiers of orientation, such as “horizontal”, “vertical”, etc., reference is made to the orientation shown in the figures.

Unless specified otherwise, the expressions “around”, “approximately”, “substantially” and “in the order of” signify within 10%, and preferably within 5%. Unless specified otherwise, the expressions “around”, “approximately”, “substantially” and “in the order of” signify within 10%, and preferably within 5%.

Figure 1A:
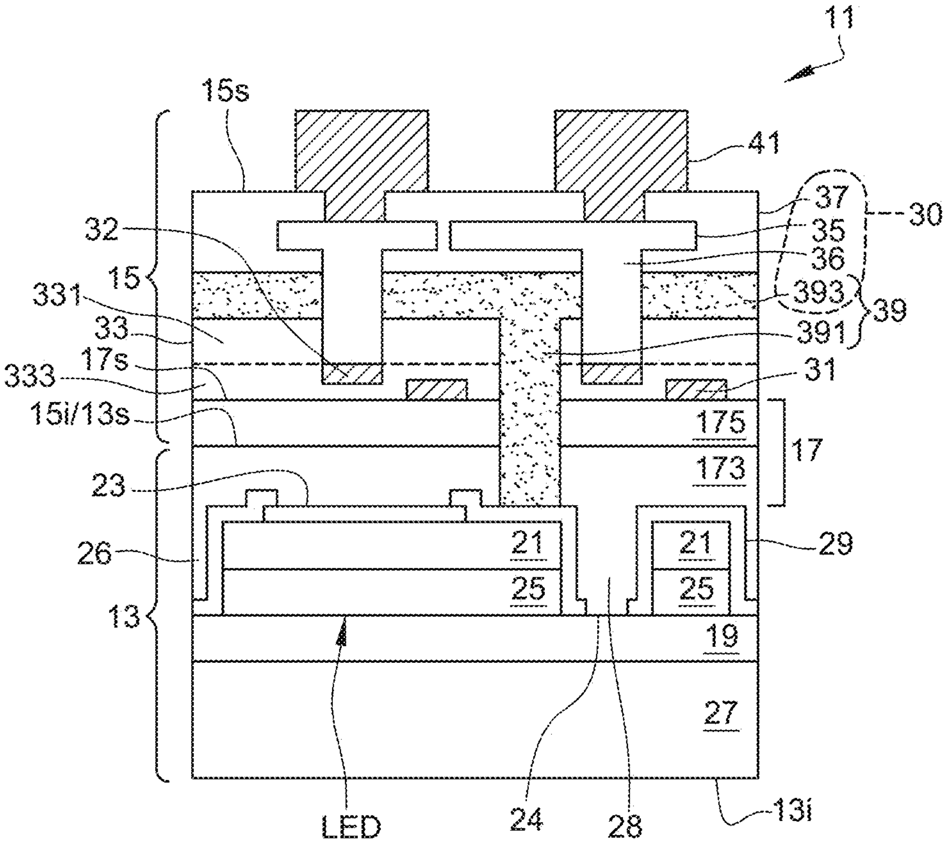
FIG. 1A illustrates a partial simplified cross-section view of an embodiment of an optoelectronic device.
Figure 1B:
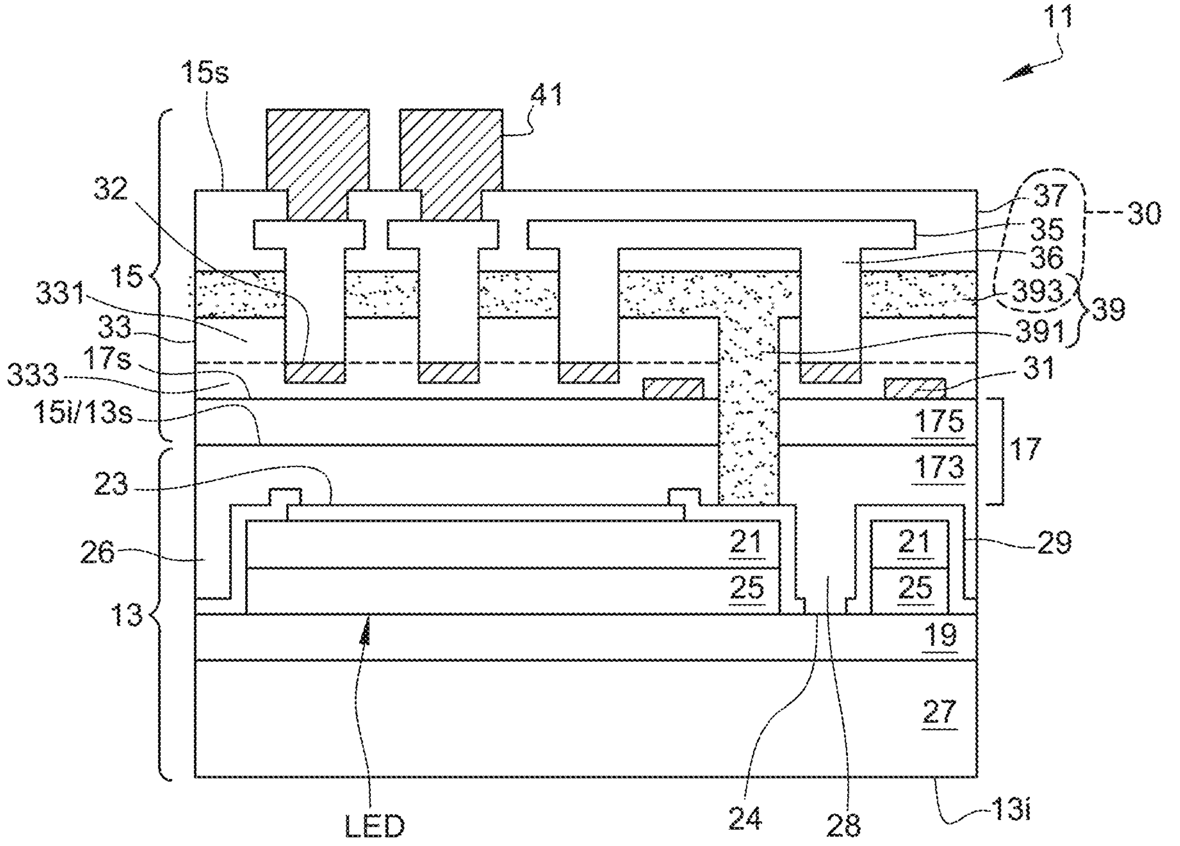
FIG. 1B illustrates a partial simplified cross-section view of a variant of the optoelectronic device shown in FIG. 1A.

FIG. 1A shows a partial simplified cross-section view of an embodiment of an optoelectronic device 11 and FIG. 1B shows a cross-section view of a variant of the optoelectronic device 11 of FIG. 1B. FIG. 2 is a partial simplified top view of the optoelectronic device 11 of FIG. 1A.

In FIGS. 1A and 1B, some of the internal elements of device 11 have been shown.

Device 11 comprises:

- a first portion 13, also called optoelectronic circuit, comprising at least one inorganic light-emitting diode LED emitting a radiation particularly towards a lower surface 13*i* of first portion 13, first portion 13 further comprising an upper surface 13*s* opposite to lower surface 13*i*; and
- a second portion 15, also called logic circuit, comprising a circuit for controlling light-emitting diode LED, and comprising a lower surface 15*i* and an upper surface 15*s* opposite to lower surface 15*i*, the lower surface 15*i* of second portion 15 being on the upper surface 13*s* of first portion 13.

According to the embodiment illustrated in FIGS. 1A and 1B, device 11 comprises, at the interface between optoelectronic circuit 13 and logic circuit 15, a layer 17 which is fragmented horizontally, that is, in the plane of upper surface 13*s*, layer 17 comprising a stack of a first sub-layer 173 located under optoelectronic circuit 13 and of a second sub-layer 175 located in logic circuit 15. As described in further detail hereafter, layer 17 is divided into two portions horizontally in the orientation of FIG. 1A, that is, in the plane of upper surface 13*s*.

Layer 17 is made of a conductive material, for example, a metallic material or a conductive polymer. Layer 17 is preferably made of titanium, of aluminum, of nickel, of silver, of copper, of gold, or of an alloy or a combination of all or part of these materials.

The upper surface of sub-layer 173 corresponds to the upper surface 13*s* of optoelectronic circuit 13 and the lower surface of sub-layer 175 corresponds to the lower surface 15*i* of logic circuit 15.

The light-emitting diode LED of optoelectronic circuit 13 comprises, according to the embodiment illustrated in FIGS. 1A and 1B, at least two semiconductor layers of opposite conductivity types defining, for example, a PN junction.

Light-emitting diode LED thus comprises a semiconductor layer 19, of a first conductivity type, for example, of type N, and a semiconductor layer 21, of a second conductivity type, for example, of type P, different from the first conductivity type. Layer 21 may have a dopant concentration in the range from $10^{15}$ to $10^{20}$ dopants/cm3 and have a thickness in the range from 5 nm to 2 μm. Layer 19 may have a dopant concentration in the range from $10^{17}$ to $10^{20}$ dopants/cm3 and have a thickness in the range from 50 nm to 2 μm. Layers 19 and 21 are for example made of a III-V compound or of a II-VI compound, for example, made of GaN (gallium nitride). Layers 19 and 21 may each have a monolayer structure or a multilayer structure.

The light-emitting diode LED of optoelectronic circuit 13 further comprises an active layer 25 located between layers 19 and 21. Active layer 25 is the layer where most of the radiative combinations causing the light emission of light-emitting diode LED occur. Active layer 25 for example has a multiple quantum well structure.

According to the embodiment illustrated in FIGS. 1A and 1B, layer 19 rests on a substrate 27. More particularly, layer 19 totally covers the upper surface of substrate 27. Substrate 27 may correspond to a growth substrate of the material forming layer 19 and may for example be made of sapphire. Substrate 27 may as a variant correspond to a transfer substrate, for example, a glass transfer substrate to replace a silicon growth substrate. Layer 25 preferably covers layer 19 and layer 25 is covered with layer 21. Layer 17 covers layer 21. The lateral edges of layers 21, 25 may exhibit a recess 26 with respect to layer 19. Device 11 further comprises a conductive via 28 crossing layers 21, 25, electrically insulated from layers 21, 25, and electrically coupling the sub-layer 173 of layer 17 to layer 19. According to another embodiment, conductive via 28 is located on an edge of layers 21 and 25. Sub-layer 173 has, for example, a thickness greater than 1.5 μm. In FIGS. 1A and 1B, via 28 is shown as stopping on the upper surface of layer 19. As a variant, via 28 may penetrate into layer 19 across a portion of the thickness of layer 19.

Optoelectronic circuit 13 further comprises a first electrode 23, for example, the anode of the LED, arranged on top of and in contact with layer 21 and a second electrode 24, for example, the cathode of the LED, corresponding to the contact between via 28 and layer 19.

First electrode 23 is, for example, made of a metallic material such as nickel, silver, gold, aluminum, copper, titanium or an alloy or a combination of all or part of these materials. First electrode 23 has a thickness, for example, in the range from 200 nm to 900 nm. First electrode 23 may have a monolayer or multilayer structure.

According to the embodiment illustrated in FIGS. 1A and 1B, optoelectronic circuit 13 further comprises a dielectric layer 29. Dielectric layer 29 preferably covers the contour of first electrode 23, a portion of layer 21 not covered with first electrode 23, the lateral edges of layers 21, 25 at the level of recess 26 and of via 28, and layer 19 at the level of recess 26 and only a portion of layer 19 at the level of via 28. Dielectric layer 29 is used as an electric insulation but also as a passivation of the lateral edges of active layer 25, which may in particular comprise quantum wells.

Layer 29 for example has a thickness in the range from 0.1 μm to 1 μm, and is made of a dielectric material such as silicon nitride or silicon dioxide or a combination of these two materials.

In the embodiment shown in FIGS. 1A and 1B, the light-emitting diode has a so-called planar structure since it corresponds to a stack of layers. According to another specific embodiment, optoelectronic circuit 13 may comprise one light-emitting diode or a plurality of three-dimensional light-emitting diodes, for example, wire-shaped or pyramid-shaped. In particular, light-emitting diode LED may comprise a three-dimensional semiconductor element, or a plurality of three-dimensional semiconductor elements, for example, nanowires or microwires, each semiconductor element being of the first conductivity type and being covered with an active area, itself covered with a semiconductor element of the second conductivity type. Electrode 23 may be in contact with the semiconductor elements of the second conductivity type, while the semiconductor elements of the first conductivity type may rest on a conductive layer in contact with via 28.

Logic circuit 15 comprises an area 33, called MOS circuit, comprising a first portion 331 comprising a substrate having insulated gate field-effect transistors, also called MOS transistors, formed inside and on top of it. The substrate may correspond to a semiconductor substrate or may have a silicon-on-insulator type structure (SOI). MOS circuit 33 further comprises an interconnection network 333 located between first portion 331 and layer 17 and comprising a stack of insulating layers between which and through which are arranged conductive tracks and conductive vias. In particular, first interconnection network 333 comprises electrically-conductive pads 31 and 32.

Logic circuit 15 further comprises a second interconnection network 30, located on MOS circuit 33, on the side of MOS circuit 33 opposite to optoelectronic circuit 13 and also capable of extending through MOS circuit 33.

Pads 32 are intended to electrically couple MOS circuit 33 and interconnection network 30. Pads 31 are intended to be, each, electrically coupled to an electrode of the light-emitting diode of optoelectronic circuit 13 via layer 17. Electrically-conductive pads 31, 32 are, preferably, made of titanium, of aluminum, of silver, of nickel, of copper, of gold, or of an alloy or a combination of all or part of these materials.

Device 11 further comprises an electrical insulation structure 39 comprising:

- an electrical insulation trench 391 enabling to ensure a horizontal electrical insulation, that is, an insulation in a plane parallel to surface 15*i* between two portions of MOS circuit 33 and between two portions of layer 17; and
- optionally, an insulating layer 393 covering MOS circuit 33 on the side of MOS circuit 33 opposite to optoelectronic circuit 13 and having the same composition as insulation trench 391.

Insulation layer 393 is preferably located in interconnection network 30 at the interface with MOS circuit 33. Layer 393 and trench 391 may have a multilayer or monolayer structure. All or part of layer 393 and of trench 391 are preferably made of a dielectric material. As an example, electrical insulation trench 391 may comprise electrically-insulating walls and a core made of a filling material, for example, a conductive or semiconductor material. For illustration purposes, insulating trench 391 is shown in FIGS. 2 and 3.

Trench 391 extends from the upper surface of MOS circuit 33 in the orientation of FIG. 1A through MOS circuit 33 and layer 17, to emerge onto dielectric layer 29. Trench 391 may be filled with a material having a multilayer or monolayer structure. Trench 391 is preferably filled with a dielectric material.

Preferably, there is at least one pad 31 on each side of trench 391.

Trench 391 has, according to the embodiment illustrated in FIG. 2, an open shape emerging onto at least one side of device 11, here onto two sides of device 11. Trench 391 particularly insulates a lateral portion of MOS circuit 33 and a lateral portion of conductive layer 17 coupled to the second electrode 24 of the light-emitting diode. As an example, in the orientation of FIG. 2, trench 391 is "L"-shaped and emerges on the top side of device 11 and on the right-hand side of device 11.

According to the embodiment illustrated in FIGS. 1A and 1B, interconnection network 30 comprises a stack of insulating layers 37 covering MOS circuit 33 on the side of MOS circuit 33 opposite to optoelectronic circuit 13, including layer 393, when present, inside of which and through which are formed conductive elements, particularly conductive tracks 35 and conductive vias 36. According to an embodiment, each conductive via 36 may be connected to one of the tracks of first interconnection network 333, for example, to one of pads 32, and thus extend through first portion 331.

According to an embodiment, there are conductive elements 35, 35 on each side of electrical insulation trench 391. These elements, on either side of electrical insulation trench 391, may be electrically coupled, for example, by one of conductive tracks 35, as shown in FIG. 1B.

According to the embodiment illustrated in FIGS. 1A and 1B, logic circuit 15 further comprises connectors 41 among which at least one of connectors 41 is coupled to first electrode 23 and at least another one of connectors 41 is coupled to layer 19.

As an example, connectors 41 are made of titanium, of aluminum, of silver, of nickel, of copper, of gold, of tin, of a tin-silver alloy, or of an alloy or a combination of all or part of these materials.

According to the embodiment shown in FIG. 1A, connectors 41 may be located on either side of insulation trench 391. However, the position of connectors 41 does not depend on the position of electrical insulation trench 391, and connectors 41 are in particular not necessarily aligned with conductive vias 36, so that connectors 41 may be located on the same side of insulation trench 391 as shown in FIG. 1B. Electric conductors 35 may for example couple a connector 41 arranged on one side of insulation trench 391 and a conductive via 36 arranged on the other side of trench 391. Further, as illustrated in FIG. 1B, an electric conductor 35 may electrically couple two conductive vias 36 arranged on either side of insulating trench 391 and electrically couple pads 32 of the first interconnection network 333 of MOS circuit 33. Conductive tracks 35 may play the role of a redistribution layer, also called RDL, that is, correspond to an additional metal layer covering MOS circuit 33 which electrically couples connectors 41 to other locations of MOS circuit 33, particularly to release the positioning constraints of connectors 41. Conductive tracks 35 particularly enable to electrically couple a connector 41, located on the portion of MOS circuit 33 located on one side of trench 391, to the portion of MOS circuit 33 located on the other side of trench 391.

According to an embodiment, not shown, MOS circuit 33 comprises transistors on one side only of insulation trench 391. The pad 31 located in the portion of MOS circuit 33 comprising no transistor is then coupled to the second interconnection network 30 with no intermediate connection by MOS transistors.

FIG. 3 illustrates, in a top view, a variant of the device 11 illustrated in FIG. 2.

According to the embodiment illustrated in FIG. 3, trench 391 follows, in top view, a closed curve, and thus has a ring shape insulating, in particular, a central island of MOS circuit 33 and a central island of conductive layer 17 coupled to the second electrode 24 of the light-emitting diode.

FIGS. 4 to 16 illustrate steps of an implementation mode of a method of manufacturing the device 11 illustrated in FIGS. 1A and 1B.

FIGS. 4 to 7 are each partial simplified cross-section views of structures obtained at successive steps of an implementation mode of the method of manufacturing a wafer comprising a plurality of optoelectronic circuits 13 such as illustrated in FIGS. 1A and/or 1B.

FIG. 4 illustrates an initial structure 45 from which a plurality of devices 11 are formed.

Structure 45 comprises, from bottom to top, in the orientation of FIG. 4:

substrate 27;

layer 19;

active layer 25; and layer 21.

Substrate 27 for example corresponds to a circular semiconductor wafer having a diameter preferably in the order of 150 mm, 200 nm, or 300 nm. Layers 19, 25, 21 are all formed full plate to substantially cover the entire upper surface of substrate 27.

Figure 5:
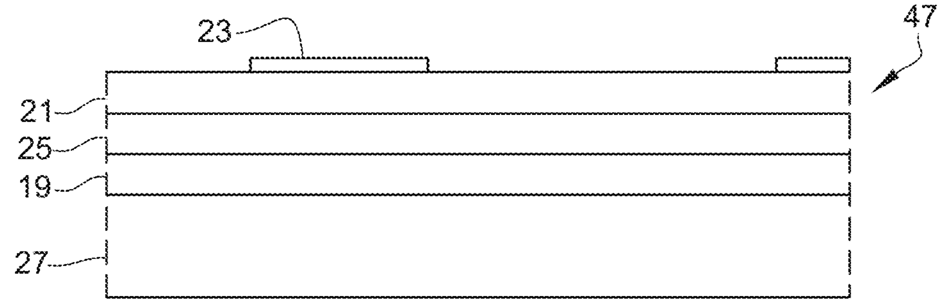
FIG. 5 illustrates another step of the method.

FIG. 5 illustrates a structure 47 obtained at the end of the forming, for each device 11, of first electrode 23 on the upper surface of the structure 45 illustrated in FIG. 4.

The material forming first electrode 23 is deposited, for example, full plate before being etched to only keep, for each device 11, first electrode 23 in the desired area. Electrode 23 is for example formed by the lift-off technique comprising depositing a resin layer, forming patterns in the resin layer, and then depositing a metal layer over the entire structure and particularly the resin patterns. The resin is then dissolved in a solvent, removing along the metal portions covering the resin patterns. The metal deposition is for example performed by physical vapor deposition (PVD) or by chemical vapor deposition (CVD).

Figure 6:
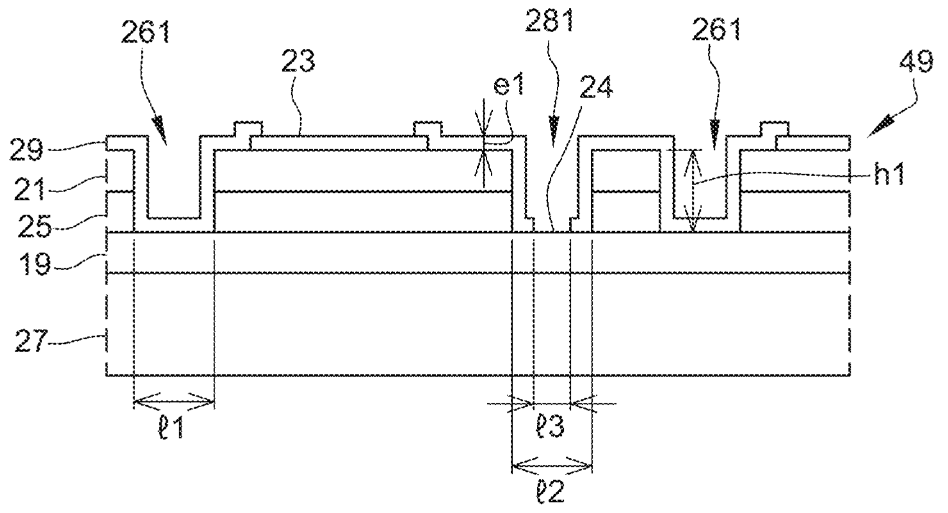
FIG. 6 illustrates another step of the method.

FIG. 6 illustrates a structure 49 obtained at the end of a step of etching and deposition of insulating layer 29 on the upper surface of the structure 47 illustrated in FIG. 5.

Structure 47 is, during the step illustrated in FIG. 6, etched to form, for each device 11, openings 261, 281 along a height h1, greater than or equal to the sum of the thicknesses of layers 21 and 25, for example, in the order of 0.5 μm. During this etching step, a portion of layer 19 opposite openings 261 and 281 may be etched in addition to layers 21 and 25. Only two openings 261 and one opening 281 have been shown in FIG. 6. Openings 261 are located at the locations at which an operation of cutting of devices 11 will be performed at a subsequent step. Openings 281 are located at the locations of vias 28.

Openings 261 for example have a width 11 in the order of 50 μm and openings 281 for example have a width 12 in the order of 10 μm in the cross-section plane of FIG. 6.

Insulating layer 29 is preferably deposited at the surface of the structure obtained at the end of the etching of openings 261, 281 so that layer 29 covers the upper surface of layer 21, the upper surface of electrodes 23, the lateral edges of openings 261, 281, and the bottom of openings 261, 281. The thickness of layer 29 is for example in the order of 1 μm.

Insulating layer 29 is then etched, for example, by wet or dry etching, to expose, for each device 11, a portion of electrode 23 and a portion of layer 19. The etching enables to expose layer 19 in openings 281 across a width 13, for example, in the order of 5 μm, in the cross-section plane of FIG. 6.

Figure 7:
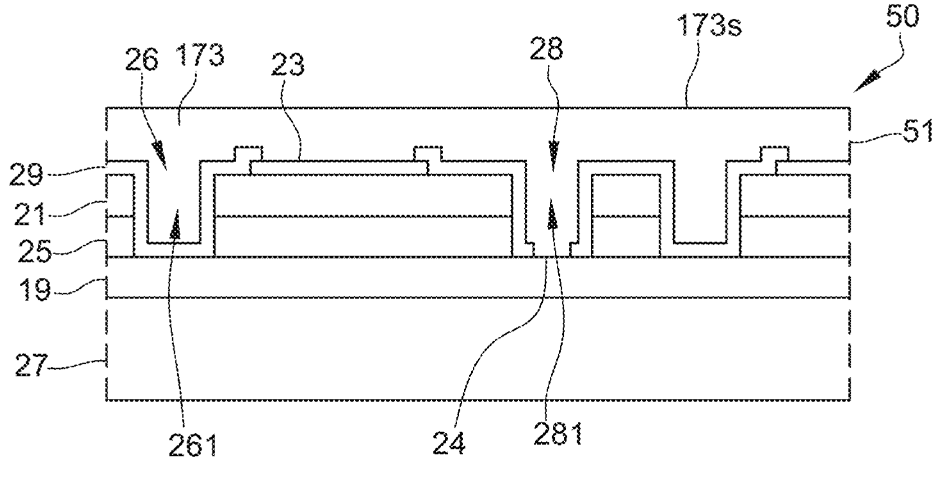
FIG. 7 illustrates another step of the method.

FIG. 7 illustrates a structure 50 obtained at the end of a step of deposition of a conductive layer 51 on the upper surface of the structure 49 illustrated in FIG. 6 to form conductive sub-layer 173 and vias 28. A wafer comprising a plurality of optoelectronic circuits 13 is thus obtained.

Conductive layer 51 is preferably deposited all over the upper surface of structure 49 so that conductive layer 51 covers insulating layer 29, comes into contact with electrodes 23, and comes into contact with semiconductor layer 19 in openings 281. Conductive layer 51 further extends in openings 261.

At the end of the step of deposition of conductive layer 51, the structure is optionally planarized by a chemical mechanical polishing (CMP).

Figure 8:
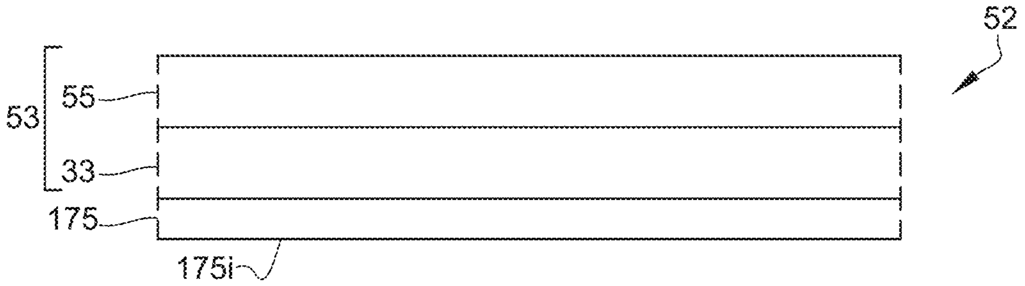
FIG. 8 illustrates another step of the method.

FIG. 8 illustrates a structure 52 comprising, from top to bottom in the orientation of FIG. 8:

a. a substrate 53; and b. sub-layer 175.

Substrate 53 preferably comprises a plurality of MOS circuits 33 and an area 55 free of any electronic components.

Substrate 53 is for example a semiconductor wafer on top of and inside of which electronic components have been formed. Substrate 53, preferably has a diameter in the order of 100 mm, 200 mm, or 300 mm. MOS circuits 33 form the lower portion of substrate 53, in the orientation of FIG. 8 and area 55 is the upper portion of substrate 53, in the orientation of FIG. 8.

Sub-layer 175 for example has a thickness greater than 500 nm.

Optionally, to planarize the lower surface of structure 52 and, more precisely, of sub-layer 175, the latter may be submitted to a chemical mechanical polishing CMP.

Figure 9:
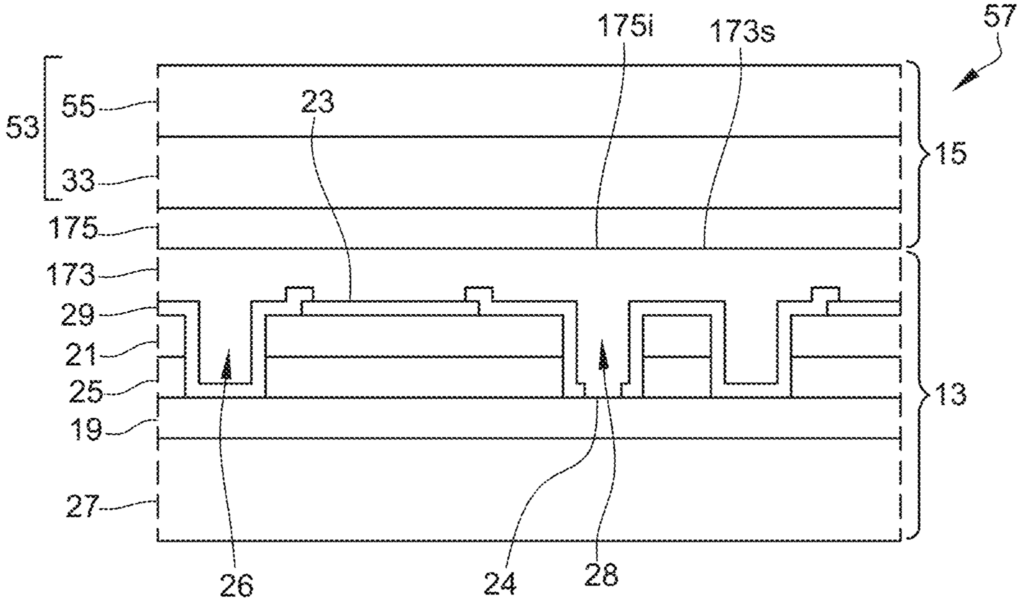
FIG. 9 illustrates another step of the method.

FIG. 9 illustrates a structure 57 obtained at the end of a step of assembly of the structure 50 illustrated in FIG. 7 and of the structure 52 illustrated in FIG. 8.

Structure 52 is transferred onto the upper surface of structure 50. More precisely, a lower surface **175*i* of the sub-layer 175 of structure 52 is transferred onto an upper surface 173*s* of the sub-layer 173 of structure 50. The step of transfer of structure 52 onto structure 50 preferably comprises a sub-step of alignment so that MOS circuits 33 are aligned with openings 261**.

According to an embodiment, the adhesion of sub-layers 173 and 175 is performed by non-hybrid conductive bonding, that is, the surfaces of the sub-layers coming into contact are planar, continuous, and made of a single material. The materials forming the two sub-layers are identical. Thus, layers 173 and 175 adhere to each other, with no bonding material.

Figure 10:
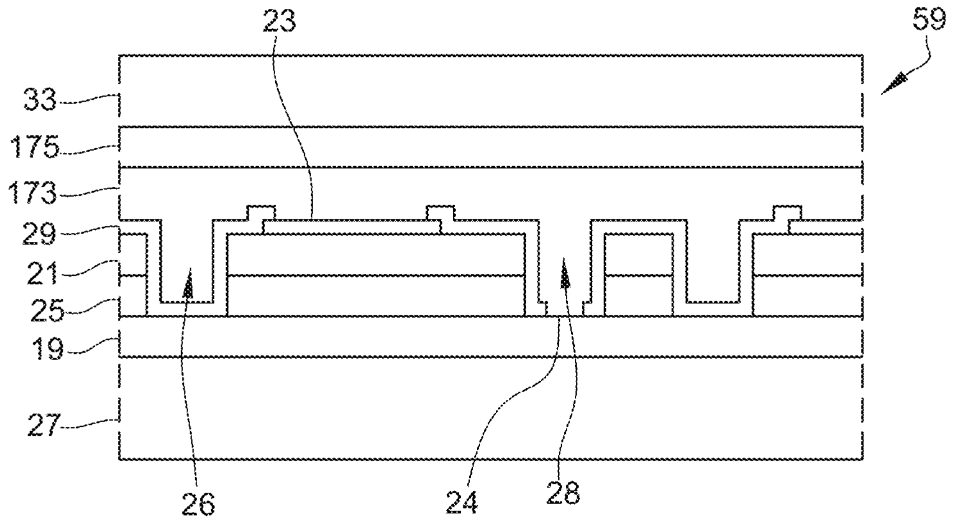
FIG. 10 illustrates another step of the method.

FIG. 10 illustrates a structure 59 obtained at the end of a step of thinning of the structure 57 illustrated in FIG. 9.

The thinning of the structure 57 illustrated in FIG. 9 is performed from its upper surface to remove area 55 of substrate 53 and only keep in substrate 53 MOS circuits 33.

Figure 11:
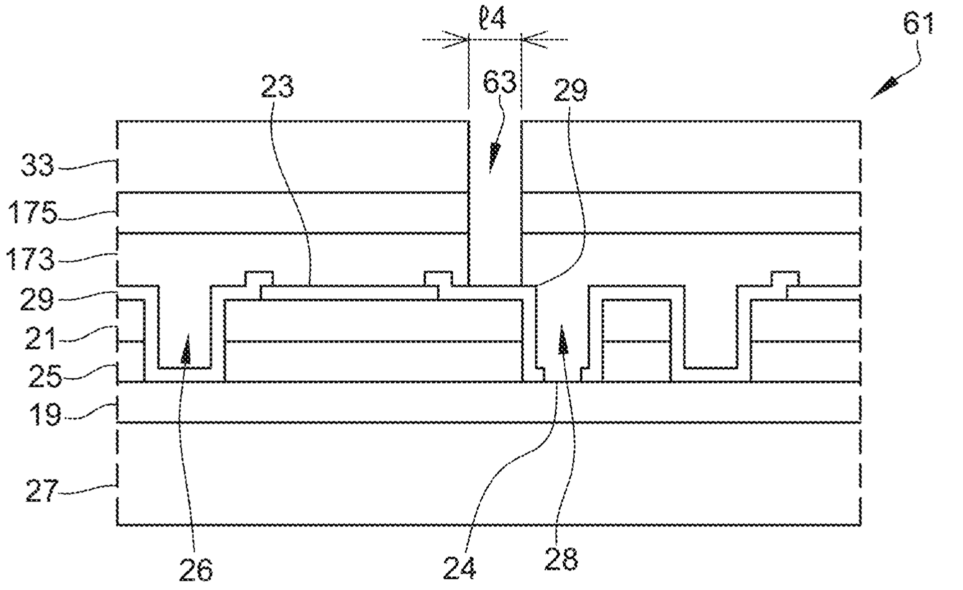
FIG. 11 illustrates another step of the method.

FIG. 11 illustrates a structure 61 obtained at the end of a step of forming of trenches 63 in the structure 59 illustrated in FIG. 10, a single trench 63 being shown in FIG. 11.

Trenches 63 preferably extend from the upper surface of structure 61 into MOS circuits 33, sub-layer 175 and sub-layer 173 to expose the upper surface of insulating layer 29.

Trenches 63 are preferably formed by a succession of two dry or wet etchings, one enabling to etch the different layers of MOS circuit 33 and the other enabling to etch sub-layers 173 and 175. Insulating layer 29 may play the role of an etch stop layer during the forming of trenches 63.

Preferably, a single trench 63 is formed by device 11, that is, each opening 261 surrounds a single trench 63. Each trench 63 is intended to become an insulation trench 391 such as shown in FIGS. 1A, 1B, and 2. Trenches 63 thus all have the same shape as insulation trenches 391.

Trenches 63 preferably have a width 14 in the order of 5 μm in the cross-section plane of FIG. 11.

Figure 12:
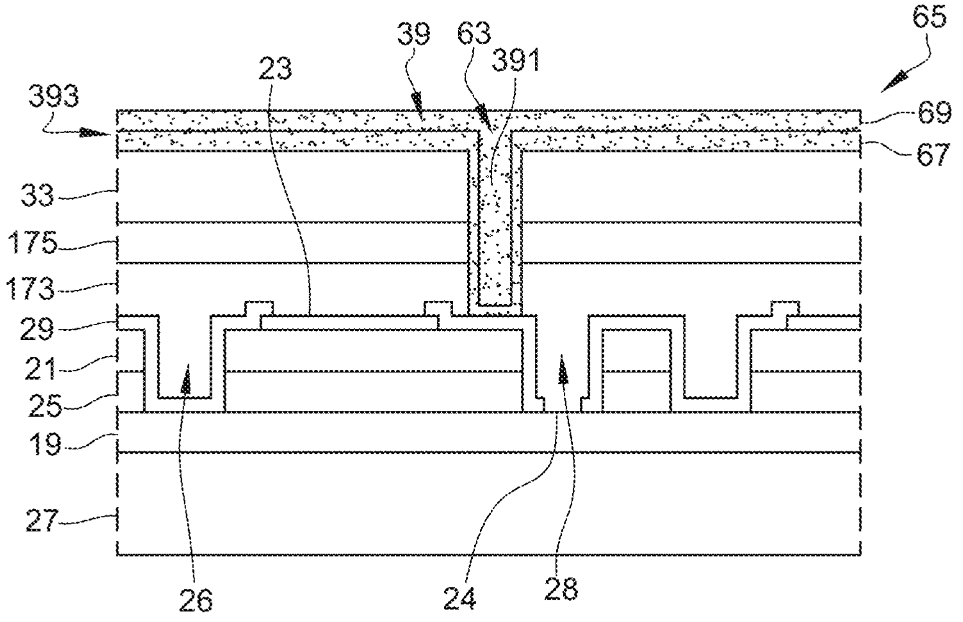
FIG. 12 illustrates another step of the method.

FIG. 12 illustrates a structure 65 obtained at the end of a step of forming of insulating structure 39 on the upper surface of structure 61 and in trenches 63.

The insulating structure 39 comprising insulating layer 393 and insulation trenches 391 is formed, preferably, by the successive deposition of two layers 67 and 69. Layer 67 is an insulating layer and is, for example, deposited on the upper surface of the structure 61 illustrated in FIG. 11 so that layer 67 covers the upper surface of MOS circuits 33 and the lateral surfaces and the bottom of openings 63. Layer 67 is preferably conformal and deposited by a vapor deposition technique.

Layer 69 is preferably deposited to integrally cover layer 67. Layer 69 for example fills trench 39. Layer 69 may be an insulating layer or a layer of a filling material, for example, polysilicon.

FIG. 13 illustrates a structure 71 obtained at the end of a step of forming, for each device 11, the stack of insulating layers 37, of conductive tracks 35, and of conductive vias 36 on top of and inside of the structure 65 illustrated in FIG. 12. FIG. 13 very schematically illustrates the electronic connection of tracks 35 to one or a plurality of the metallizations of MOS circuit 33, schematized in FIG. 13 by pads 32, and this, by vias 36. FIG. 14 is an enlargement of a portion 73 of structure 71.

According to an embodiment, pad 32 corresponds to a track of any of the metallization levels of MOS circuit 33, preferably, the first level. To reach track 32, each via 36 crosses, for example:

c. layer 37; and d. the first portion 331 of MOS circuit 33.

The forming of vias 36 preferably comprises an etch step enabling to etch the portion 331 of MOS circuit 33 across a thickness in the range from 3 μm to 5 μm. Vias 36 preferably each have a width 15 greater than 6 μm. At the end of the etch step, the deposition of an insulating layer 81, for example, of silicon dioxide, is for example performed by a plasma-enhanced chemical vapor deposition technique (PECVD). Layer 81 preferably has a thickness in the order of 0.5 μm. At the end of the step of deposition of layer 81, the latter is etched to expose a portion of the upper surface of pads 32 (or of a pad 31 in the event where MOS circuit 33 comprises no transistor on one side of insulation trench 391) at the bottom of the openings formed in MOS circuit 33. The etching of layer 81 enables to expose pads 32 along a length 16 greater than 3 μm. After the step of etching of layer 81, a metal layer 83, for example, made of aluminum, tungsten, copper, or a combination or an alloy of these two materials, is deposited. Layer 83 is preferably deposited by a physical vapor deposition technique. Layer 83 thus covers layer 81 and comes into contact with pads 32. Layer 83 preferably has a thickness in the order of 1 μm. Layer 83 is then etched to be kept to only form vias 36 and optionally the conductive tracks 35 such as illustrated in FIG. 13.

Figure 15:
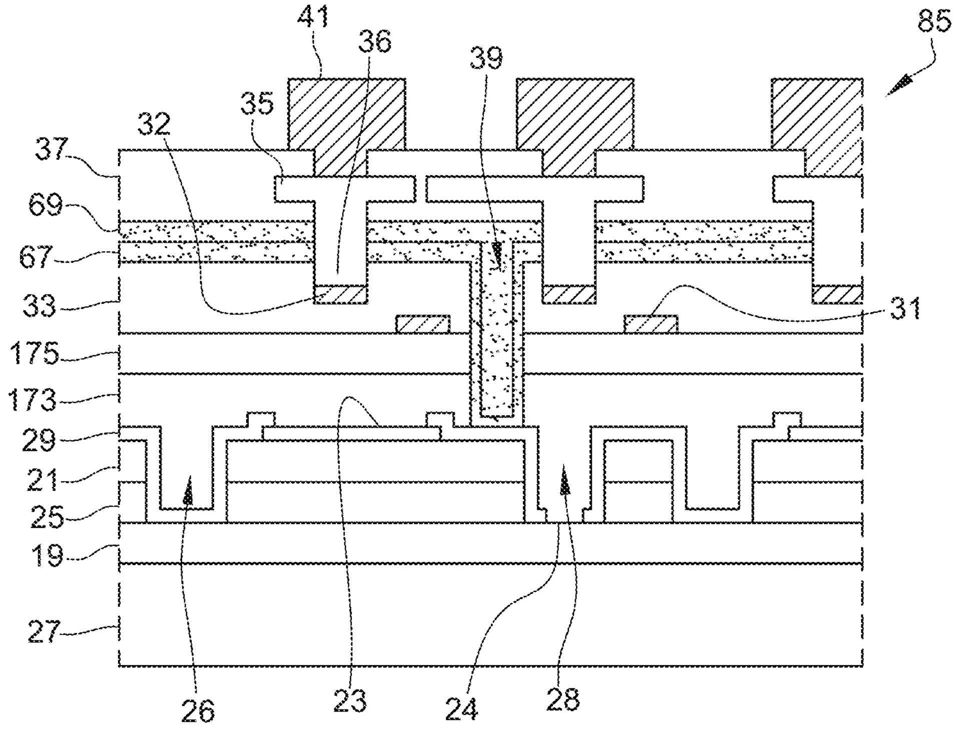
FIG. 15 illustrates another step of the method.

FIG. 15 illustrates a structure 85 obtained at the end of a step of forming of connectors 41 on the upper surface of the structure 71 illustrated in FIG. 13.

Connectors 41 are formed in contact with tracks 35. Preferably, for each device, at least one connector 41 is coupled to electrode 23 and at least one connector 41 is coupled to layer 19.

Figure 16:
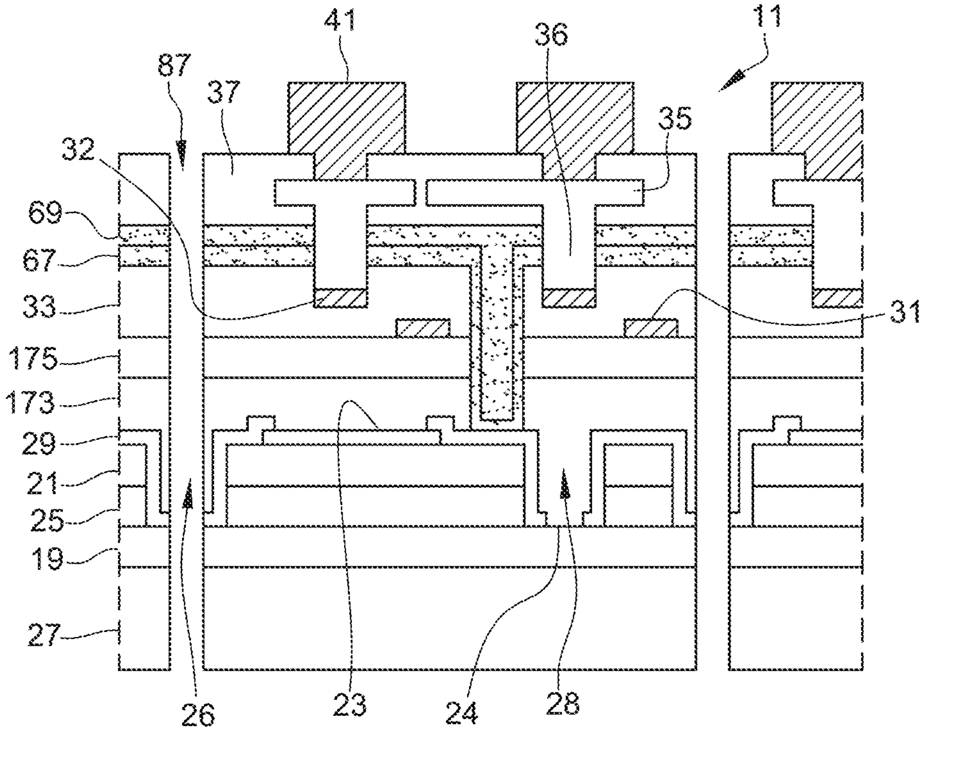
FIG. 16 illustrates another step of the method.

FIG. 16 illustrates a plurality of devices 11 obtained at the end of a step of cutting of the structure 85 illustrated in FIG. 15.

The structure 85 illustrated in FIG. 15 is for example sawn to form trenches 87 by means of a blade having a thickness, for example, in the order of 40 μm.

Trenches 87 are through and enable to cut structure 85 into unit devices 11. Trenches 87 extend, for example, in logic circuit 15 and in optoelectronic circuit 13 in openings 261. The step of sawing structure 85 may be preceded by a step of thinning substrate 27 across a thickness in the order of 300 μm.

Figure 17:
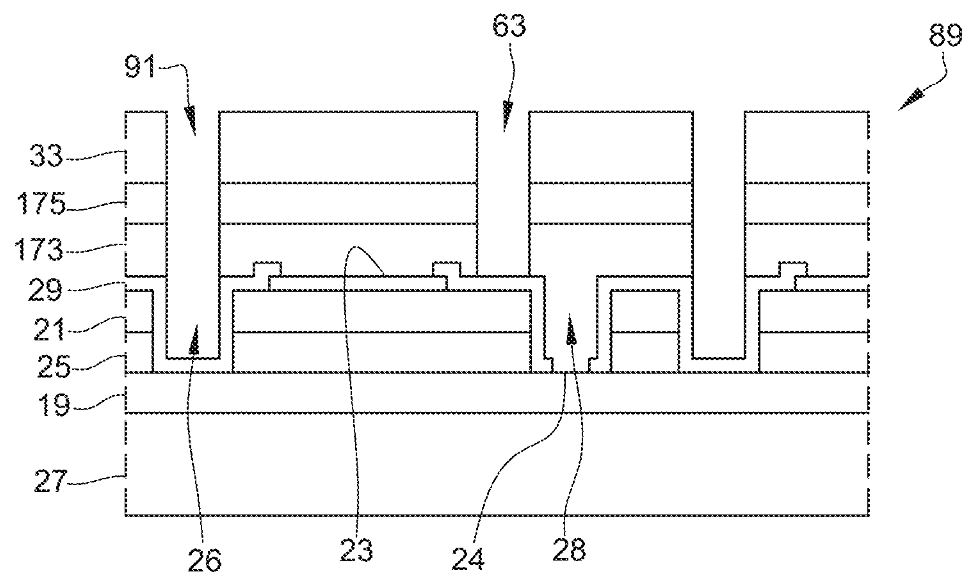
FIG. 17 illustrates a step of another implementation mode of a method of manufacturing the device illustrated in FIGS. 1A and 1B.
Figure 18:
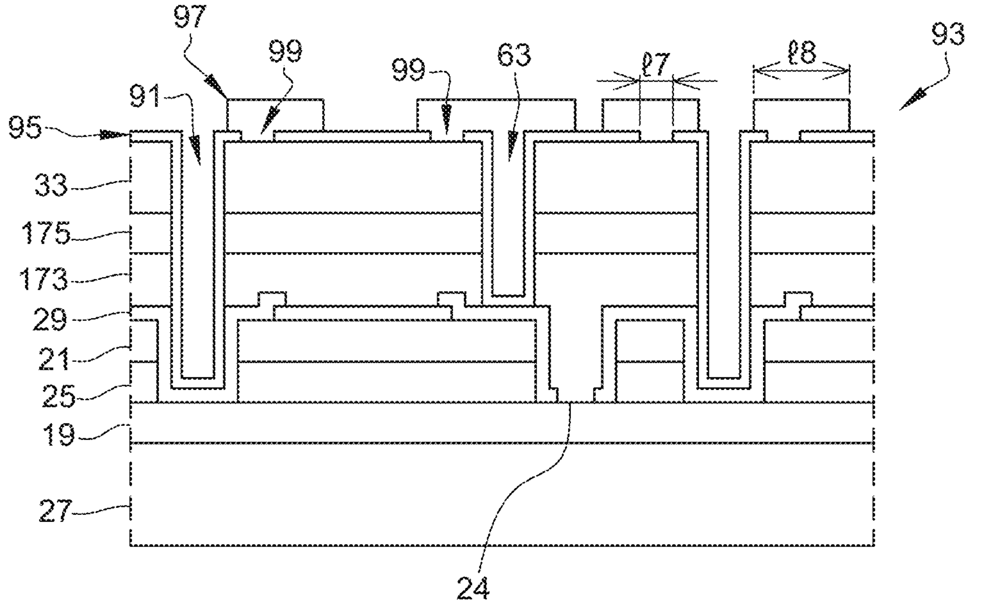
FIG. 18 illustrates another step of the method.

FIGS. 17 and 18 are partial simplified cross-section views of structures obtained at steps of another implementation mode of a method of manufacturing a variant of the optoelectronic device 11 shown in FIG. 1A.

More particularly, FIG. 17 illustrates a structure 89 obtained at the end of a step of forming of trenches 91 in the structure 61 illustrated in FIG. 11. Trenches 91 may be formed simultaneously to trenches 63.

Trenches 91 preferably extend from the upper surface of structure 89 into structure 89. Trenches 91 preferably extend through MOS circuit 33, sub-layer 175, and sub-layer 173 to expose layer 29 in openings 261. Trenches 91 preferably have, in top view, the same dimensions and the same shape as the dimensions and the shape of openings 261. In other words, during this step, the layers underlying layer 29 are removed vertically in line with openings 261.

FIG. 18 illustrates a structure 93 obtained at the end of a step of deposition of an insulating layer 95 and of a step of forming of conductive regions 97 on the upper surface of structure 93.

Insulating layer 95 is preferably a silicon dioxide layer. Insulating layer 95 is preferably deposited by PECVD across a thickness in the order of 1 μm. Openings 99 are then etched in insulating layer 95. Structure 93 preferably comprises at least one opening 99 on each side of trench 63. Openings 99 for example each have a width 17 greater than 3 μm.

Metal regions 97 are preferably made of aluminum, of copper, or of a combination or an alloy of these two materials. Metal regions 97 may have a single-layer structure or a multilayer structure. Regions 97 are preferably formed to extend in openings 99. Regions 97 are formed, preferably, across a width 18 greater than 10 μm.

Regions 97 are preferably connected to metal tracks of MOS circuit 33 similarly, for example, in way analogous to what has been previously described in relation with FIG. 13.

At the end of this step, connectors (not shown in FIG. 18), similar to the connectors 41 illustrated in FIG. 15, are formed inside of and in contact with regions 97.

An advantage of the described embodiments and implementation modes is that they enable to bond logic circuit 15 and optoelectronic circuit 13 at rather low temperatures (that is, lower than 250° C.), which limits risks of damaging of the materials forming the optoelectronic circuit.

Another advantage of the described embodiments and implementation modes is that they enable to increase the reliability of the bonding of logic circuit 15 and of optoelectronic circuit 13 as compared, for example, with a hybrid bonding, based on contact pads.

Still another advantage of the described embodiments and implementation modes is that they enable to assemble the substrate of the light-emitting diodes and the substrate of the control circuits with positioning accuracy constraints lighter than for a hybrid bonding.

Still another advantage of the described embodiments and implementation modes is that, as compared with document U.S. Ser. No. 10/468,452, there are no constraints on the electric connection between circuits 15 and 13.

Still another advantage of the described embodiments and implementation modes is that they enable to maximize the useful surface area of the LED formed on a same growth surface.

Still another advantage of the described embodiments and implementation modes is that they enable to limit risks of damaging of substrate 27, given that insulation trench 391 does not extend all the way to substrate 27.

An advantage of the described embodiments and implementation modes is that they are compatible with usual component production lines in microelectronics.

Various embodiments and variants have been described. Those skilled in the art will understand that certain features of these various embodiments and variants may be combined, and other variants will occur to those skilled in the art. In particular, in the previously-described embodiments, to be able to perform the molecular bonding of sub-layer 173 to sub-layer 175, the flatness of the surface 13*s* of sub-layer 173 is obtained by an optional planarization step carried out after the deposition of sub-layer 173 and the flatness of the surface 15*i* of sub-layer 175 is obtained by an optional planarization step carried out after the deposition of sub-layer 175. As a variant, the flatness of the surface 13*s* of sub-layer 173 may be obtained by the deposition, before the forming of sub-layer 173, of an electrically-insulating planarization layer, for example, an oxide, on the underlying structure, by the forming of vias crossing this insulating planarization layer, and then by the deposition of sub-layer 173 on the planarization layer and in contact with the vias, sub-layer 173 then directly having the desired flatness properties. The forming of the insulating planarization layer may comprise the deposition of at least one insulating layer followed by a step of planarization, for example, by CMP. Similarly, the flatness of surface 15*i* of sub-layer 175 may be obtained by the deposition, before the forming of sub-layer 175, of an electrically-insulating planarization layer, for example, an oxide, on the underlying structure, by the forming of vias crossing this insulating planarization layer, and then by the deposition of sub-layer 175 on the planarization layer and in contact with the vias, sub-layer 175 then directly having the desired flatness properties.

Finally, the practical implementation of the described embodiments and variations is within the abilities of those skilled in the art based on the functional indications given hereabove.

The invention claimed is:

1. Optoelectronic device comprising a stack:

of a first circuit comprising at least one inorganic light-emitting diode emitting through a first surface of the first circuit and comprising first and second electrodes; and of a second circuit for controlling the light-emitting diode, positioned on a second surface of the first circuit opposite to the first surface, comprising first and second electrically-conductive pads, wherein an electrically-conductive layer comprising the stacking of a first electrically-conductive sub-layer of the first circuit and of a second electrically-conductive sub-layer of the second circuit, is located at the interface between the first and second circuits, the electrically-conductive layer being divided into first and second portions orthogonally to the stacking direction of the first and second circuits, the first electrode being electrically coupled to the first conductive pad via the first portion of the conductive layer and the second electrode being electrically coupled to the second conductive pad via the second portion of the conductive layer, wherein the first and second conductive portions of the electrically-conductive layer are separated by an electrical insulation trench.

2. Device according to claim 1, comprising at least two connectors, located on the second circuit, on the side opposite to the first circuit, intended to electrically couple the device to an external object.

3. Device according to claim 1, wherein the first and second conductive pads are separated by said electrical insulation trench.

4. Device according to claim 1, wherein the second circuit comprises metal oxide gate field-effect transistors and comprises two portions electrically separated by said electrical insulation trench.

5. Device according to claim 4, wherein the portions of the second circuit are electrically coupled by connections by electrically-conductive tracks located on the side of the metal oxide gate field-effect transistors opposite to the first circuit.

6. Device according to claim 1, wherein the electrical insulation trench has a closed shape, in a plane parallel to the second surface.

7. Device according to claim 1, wherein the electrical insulation trench has, in a plane parallel to the second surface, an open shape having its two free ends emerging onto one or a plurality of the sides of the device.

8. Device according to claim 1, wherein the first circuit comprises a substrate on the side of the first surface.

9. Device according to claim 8, wherein the substrate is made of sapphire or of glass.

10. Device according to claim 1, wherein the conductive layer is made of metal or of a conductive polymer.

11. Device according to claim 1, wherein the light-emitting diode is wire-shaped or pyramid-shaped.

12. Device according to claim 1, wherein the first electrically-conductive sub-layer covers the totality of the first electrode.

13. Structure comprising a plurality of optoelectronic devices according to claim 1.

14. Method of manufacturing a plurality of optoelectronic devices according to claim 1, comprising a step a) of assembly of a first wafer comprising said plurality of first circuits to a second wafer comprising said plurality of second circuits.

15. Method according to claim 14, wherein assembly step a) is carried out by placing into contact, full plate, first and second sub-layers of the electrically-conductive layer.

16. Method according to claim 14, wherein each first circuit is partially etched at a step b) prior to step a) to define a first cavity located at the location of the second electrode.

17. Method according to claim 16, comprising a step c), between steps a) and b) or b'), where each light-emitting diode is covered, on the side of the second surface of the first circuit, with a dielectric layer open at the level of the first and second electrodes.

18. Method according to claim 17, wherein between step c) and step a), each light-emitting diode is covered, on the side of the second surface of the first circuit, with the first conductive sub-layer.

19. Method according to claim 18, wherein each second circuit is covered, before step a), with the second conductive sub-layer.

20. Method according to claim 19, wherein assembly step a) is carried out by a non-hybrid bonding of the first conductive sub-layer with the second conductive sub-layer.

21. Method according to claim 14, wherein each first circuit is partially etched at a step b') prior to step a) to form a second cavity enabling to define the edges of said light-emitting diode.

22. Method according to claim 14, wherein step a) is followed by a step d) of etching, for each optoelectronic device, of a trench extending in the second wafer and in the electrically-conductive layer all the way to the dielectric layer.

23. Method according to claim 22, wherein step d) is followed by a step of filling of the trench with an insulating material.

* * * * *